US007715743B2

(12) United States Patent
Swift et al.

(10) Patent No.: US 7,715,743 B2
(45) **Date of Patent: *May 11, 2010**

(54) CHARGER WITH A PROBE AND CONTROLLER

(75) Inventors: Joseph A. Swift, Ontario, NY (US); Tyco Skinner, Boston, MA (US); Michael F. Zona, Holley, NY (US); R. Enrique Viturro, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 462 days.

This patent is subject to a terminal disclaimer.

(21) Appl. No.: 11/707,369

(22) Filed: Feb. 16, 2007

(65) Prior Publication Data

US 2008/0199195 A1 Aug. 21, 2008

(51) Int. Cl.
*G03G 15/02* (2006.01)
*G03G 15/00* (2006.01)
*G01R 29/12* (2006.01)
*G01R 27/26* (2006.01)

(52) U.S. Cl. ............................ 399/50; 399/24; 399/31; 324/457; 324/660

(58) Field of Classification Search ................... 399/48, 399/50, 100, 115, 168, 170–173, 311, 24, 399/31; 250/306, 324–326; 324/455–457, 324/713, 660
See application file for complete search history.

(56) References Cited

U.S. PATENT DOCUMENTS

| | | | | |
|---|---|---|---|---|
| 5,361,123 | A * | 11/1994 | Yeh et al. | 399/50 |
| 5,781,003 | A * | 7/1998 | Kondo | 324/96 |
| 6,544,478 | B1 * | 4/2003 | Oyama et al. | 422/82.01 |
| 6,819,893 | B2 * | 11/2004 | Kikuchi | 399/100 |
| 7,170,842 | B2 * | 1/2007 | Gibson | 369/101 |
| 7,518,376 | B2 * | 4/2009 | Swift et al. | 324/457 |
| 2006/0087324 | A1 * | 4/2006 | Berggren et al. | 324/600 |
| 2006/0267593 | A1 * | 11/2006 | Ichimura et al. | |

* cited by examiner

*Primary Examiner*—David P Porta
*Assistant Examiner*—Milton Gonzalez
(74) *Attorney, Agent, or Firm*—James J. Ralabate

(57) ABSTRACT

This is a charging assembly that is useful in marking processes with an electrostatically charged surface. The assembly includes, besides the charger, a controller and an electric field probe. Charge and current flows can be detected by the probe and corrected immediately after detection of flaws by the probe and conveyed to the controller. If flaws in the charger are determined by the probe, corrections are made to the output by a controller; this is done before a final copy or print is made. The term flaws as used means any non-uniform appearing region in the printed image or any otherwise unacceptable defect. The probe is enabled to detect and indicate flaws and the controller which is in communication with the probe takes corrective action on the flaws. The probe used is a novel probe having two sensing elements surrounded by one or more reference electrodes.

6 Claims, 7 Drawing Sheets

CHARGER WITH A PROBE AND CONTROLLER

CROSS REFERENCE

Illustrated and disclosed in a application U.S. Ser. No. 11/707,355, now U.S. Pat. No. 7,518,376 owned by the present assignee is a related application. U.S. Ser. No. 11/707,355 discloses and claims an electronic scanning probe (useful in electrostatic working systems) made up of at least two sensing elements, each sensing element substantially surrounded by one or more reference electrodes. These sensing elements are separated at a distance that causes little or no cross-interference to take place between these sensing elements when positioned in concert with a surface of interest. This probe is adapted for use in electrostatic marking systems where an electrostatic charge is placed onto a receiving surface.

This invention relates to electrostatic marking systems and more specifically to the charging components of these systems.

BACKGROUND

In an electrostatographic process, a system is used whereby a uniform electrostatic charge is placed upon a reusable photoconductive surface. The charged photoconductive surface is then exposed to a light image of an original to selectively dissipate the charge to form a latent electrostatic image of the original on the photoreceptor. The latent image is developed by depositing finely divided marking and charged particles (toner) upon the photoreceptor surface. The charged toner is electrostatically attached to the latent electrostatic image areas to create a visible replica of the original. The toned developed image is then transferred from the photoconductor surface to a final image support material, such as paper, and the toner image is fixed thereto by heat and pressure to form a permanent copy corresponding to the original.

In Xerographic systems of this type, a photoreceptor surface is generally arranged in a drum or belt configuration to move in an endless path through the various processing stations of the Xerographic process. The photoconductive or photoreceptor surface is generally reusable whereby the toner image is transferred to the final support material, and the surface of the photoreceptor is prepared to be used once again for another reproduction of an original. In this endless path, several stations of corona charging are traversed. These charging stations may involve one or a cluster of chargers including dicorotron or other corotron units.

Several methods and devices are known for applying an electrostatic charge to the photosensitive member such as the use of electron-emitting pins, an electron-emitting grid, single corona-charging structures and single or multiple dicorotron wire assemblies. These will be referred to as "chargers" throughout this disclosure and claims. In recent development of multifunctional Xerographic machines where copiers can provide several functions, the need for several reliable chargers or charging assemblies exists in order to assure that high quality final copies are produced.

Usually, in electrostatographic or electrostatic copy processes, as those above noted, a number of chargers such as corotrons, scorotrons, or dicorotrons are used at several various stations around the photoreceptor. For example, the chargers are used at the station that places a uniform charge on the photoreceptor, at a transfer station, at a cleaning station, etc. In today's high speed copiers, it is important that all corotrons (or chargers) are controlled for efficient and uniform charging. Generally, one structure of a dicorotron charger uses a thin, glass-coated wire mounted in an elongated U-shaped housing between two insulating anchors called "insulators". These support the wire in the U-shaped housing in a spring-tensioned manner in a singular plane. This dicorotron unit or assembly, as above noted where aluminum usually comprises the housing, is in one embodiment an elongated U-shaped shield. The wire or corona-generating electrode is typically a highly conductive, elongated wire situated in close proximity to the photoconductive surface to be charged.

As earlier noted, the charging of the photoreceptor or other surfaces is necessary for the proper reliable operation of the Xerographic machine.

Charging devices historically come in several forms including wires, pins, grids, and the like and are generally referred to as corotrons, scorotrons and dicorotrons; all will be referred to in this disclosure as "chargers" or a source of "corona" discharge. These charging devices typically use high voltages to create a corona which contains electrons and/or ions for deposit on a surface.

Non-uniform charging caused by dirty wires or an otherwise faulty charger cause the appearance of a printed copy to appear blurry or have areas where the image is entirely missing (deleted). Corrective means and specifically automated and continuous corrective means for countermining the effects of dirty chargers, faulty chargers, or improperly installed chargers are seriously needed.

With the advent of high speed xerography reproduction machines wherein printers can produce at a rate in excess of three thousand copies per hour, the need for corotrons or dicorotrons at many processing stations is needed in a reliable and dependable manner in order to utilize the full capabilities of the reproduction machine. These corotron systems must operate flawlessly to virtually eliminate unacceptable print quality and machine shutdowns due to corotron malfunctions.

Generally, in electrostatographic or electrostatic printing processes, a number of corotrons or dicorotrons are used at various stations around the photoreceptor. For example, the dicorotrons are used at the station that places an initial uniform charge on the photoreceptor, at a transfer station to control the charge on the backside of the media receiving the toned image, at a cleaning station where reduction of the intensity of the electrostatic forces between the photoreceptor and toner is required and at a plurality of other related processes. In today's high speed printers, it is important that all corotrons (or dicorotrons) are in perfect working order since one corotron malfunction can easily render the entire printing process useless. Some high speed printers including color printers use several dicorotron units. In one embodiment, as many as sixteen corotron or dicorotron units are used. So, maintaining each corotron or dicorotron unit in perfect working order is essential to the proper functioning of these complex fast color printers. It is common to use one or several corona-generating device(s) ("corotron" or "dicorotron") for depositing the electrostatic at the above-noted stations. Generally, the structure of a dicorotron uses a thin, glass-coated wire mounted between two insulating anchors or end blocks called "anchors" which support the wire in a highly tensioned manner in a singular plane. In this disclosure, the term "anchors" includes insulator, end blocks, insulating anchors, etc. These anchors are installed between flexible holders or clamps or anchor inserts that maintain the anchors in place. These anchor inserts are fixed at two opposite ends of a U-shaped dicorotron "housing" or "shells" or "shield". The wire or corona-generating electrode is typically a highly conductive elongated wire situated in close proximity to the photoconductive surface to be charged. Often, the corona discharge electrode is coated with a dielectric material such as glass, for glass coating improves charging uniformity throughout the electrode's life. Since the wire electrode is comprised of a thin outer glass brittle coating, it may be easily damaged or dirtied, or contaminated as earlier noted. In some instances even very gentile handling or cleaning of this electrode often results in fracture of the glass coating which could cut or injure the user, cause damage to surrounding parts, or cause contamination to the printer itself. While cleaning sometimes corrects problems in this corona electrode, it is sometimes necessary to replace the wire due to degradation in the corona performance or even in breakage of the electrode which could occur during the cleaning.

If the flaws in the charger are determined by a suitable sensing device such as a field probe, particularly a high resolution field probe and subsequent corrections are made to the output by a suitable controller before the final copy or print is made, a high advance in electrostatic marking systems will be accomplished. Since the output from a charger can vary across the length, width, and area of the charging element, precise control of the output over vary small, local areas of the charger to achieve a uniform output across the entire area of the charger device is needed. Irregularities or non-uniformities in the local output of a charger over a width of as little as a few micron or less, or over an area of about 10 square microns, or less can cause flaws within and thereby adversely impact upon the quality of a xerographic print. Controllers of the type integral close feedback loop controllers, or proportional, or a proper combination of them, can process the sensed charge surface and provide actionable information sequentially distributed to various actuators. The actuators considered include controlling the output of the charge device, which, depending on the type of charge device, can be accomplished by changing the voltage input to each of the charging elements of the charge device. Considered distributed controller schemes include multiobjective distributed controllers using other actuators to compensate for the flaws in the charger, like modulating pixel to pixel the laser exposure in order to compensate for the charge variability across the charged photoreceptor surface, or by replacing the faulted charging device. In a process color reprographic machine, for example a CMYK printer, the controller scheme described above is repeated for each color. But this concept is extended to other xerographic base machines, for example, machines printing black and one or more highlight colors, five or more process color machines, and so on. By the term "flaws in a charger" is meant non uniform charging or contaminated or dirty wires or faulty corotron (charger) installation which would result in perturbation, including a microscopic perturbation or disturbance, in the output corona or ion stream. By the term "flaws in a print" is meant any undesired, non-uniform appearing region in the printed image, any void region within the printed image or otherwise unacceptable defect such as a jagged line that is visible or otherwise detected by the end-user.

SUMMARY

The present invention provides embodiments of a charger that comprise as part of its structure an electric field probe and a controller. With this configuration charge or current flows can be detected by the probe and corrected by the controller immediately after detection. In one embodiment a scanning field probe that is designed to move in relationship to the charged surface of interest and may scan the entire surface is highly preferred for use in this invention and may detect low intensity signals and small variations in a charged surface such as a photoconductive surface of an electrostatic marking apparatus. Optionally, it uses multiple sensing elements which may be contained in a single mounting. Further optionally, it uses multiple sensing elements and at least one controller which may be contained in a single mounting. The sensing elements are micron or sub-micron sized. Furthermore, the multiobjective distributed controller scheme enables the use of complementary actuators, like laser exposure, to make additional compensations for incomplete charge compensations. The controller uses the well known relationship, as stated by the photo-induced discharge curve (PIDC), between the charge on the photoreceptor surface and the level of light exposure. In the case of charge devices of the type corotrons and dicorotrons, which do not have spatially discrete charging capabilities, the control on the charging level does not eliminates charge nonuniformities, and laser exposure is the actuator of choice. The controller of this invention in one embodiment comprises logic, software, and communication means with the probe and can include a display such as an electrometer. The controller of this invention in one embodiment comprises logic, software, and communication means with the probe and with the charging device. The controller of this invention in one embodiment comprises a number of controller functions, which can receive input signals from more than one sensor, and preferably a large number of probes, and perform an assessment or comparison using the large number of inputs and provide a large number of output signals that serve to adjust the operational state, such as uniformity of charge output across the entire area, of a charging device. The probe will convey either analog or digital information concerning flaws created by the charger and the controller will either automatically correct this flaw or indicate to the user the corrective action needed. For example, if the flaw is related to an incorrectly installed charger, the probe will identify a charge defect by monitoring the quality or quantity of charge deposited on the target surface or by directly measuring the charger's emitted charge or ion stream characteristics and the controller with proper logic and software will indicate the corrective action needed which may involve, for example removal and reinstallation of the charging device. The same sequence will apply to other flaws such as dirty chargers, or defective chargers. Any suitable type of controller may be used including those specified in [010] above.

While any suitable probe can be used as a component of the charger structure of this invention, the probe defined in the co-pending application based on U.S. Ser. No. 11/707,355 is highly preferred because of its excellent utility, compactness of size, robustness, and ease of use. While the use of the structure of this invention will be described in reference to an electrostatic marking process, it can be used with any surface bearing an electrostatic charge.

The probe used in embodiments of this invention includes the novel probe defined in co-pending application based upon U.S. Ser. No. 11/707,355 the disclosure of which is totally incorporated by reference into the present disclosure.

The novel electric field probe preferably used in the present invention is a high resolution, multifunctional field probe that uses in one embodiment at least one miniature sensing element contained in close proximity to a reference plane. Positional or area scanning may be one of the functions of the probe. When positioned adjoining, but not in direct contact with, a charge containing surface, an output signal proportionate to the local charge can be produced. The "local" charge is defined herein as the area of charge or area of mixed charges that resides immediately in view of the sensor.

Charges that lay outside of this area are defined as "far-field" charges. Optionally multiple sensing elements with suitable reference planes can be closely aligned to each other within a single mounting. Optionally a large number of multiple sensing elements, such as 100, or 1,000, or even 10,000 or more, with suitable reference plane or planes can be closely aligned to each other within a single mounting and used to monitor small area characteristics, including micron-size and sub-micron size flaws and other fine perturbations within and/or caused by the subject charger. The cross sectional dimension of the sensing elements can be large or macroscopic, for example micron sized, or preferably sub-micron sized to achieve the greatest resolution capabilities. By "micron sized" is meant within a range of about 1 to about 1000 microns. By "sub-micron sized" is meant within a range of less than 1 micron to less than about 1 nanometer (nm) Pairings of sensing elements in one embodiment can be aligned and moved in tandem and in precisely the same path during scans of the charger and/or charge containing surface of interest. Alternately, pairs of sensing elements can be positioned in a stationary manner to observe two side-by-side areas of a large area sample, which may be stationary or moving. The signals from each element or from pairings of two or more elements are processed by a variety of ways to enable custom data flows, sets, and analyses. For example, each element of a pair of sensing elements or sensors can be coupled to a suitable operational differential amplifier programmed to exercise a differential algorithm and thereby produce a single output signal that represents a combination of positional and/or amplitudinal parameters of interest. The output of the differential comparator electronic device can be amplified (by a solid state op amp) and filtered if required to produce the level and quality of signal as needed to be displayed on a contemporary meter device, such as an electrometer. Any suitable electrometer may be used with the present probe, such as those manufactured by Keithley Instruments of Cleveland Ohio, including their 610c and 6517 series electrometers. Appropriate voltmeters, ammeters and any suitable coulomb (charge) meter depending upon the design and details of the measurement circuit may be used. Since both sensors of a pair measure the same target in close time and spatial sequence, the relative portrayal of any rapidly changing charge and/or topography features are amplified, and, any noise detected by each of the sensors can be eliminated from the resultant output by the signal differentiation function thereby improving signal to noise and detection capability. Further amplification and filtration of the complex output signal may be performed depending upon the requirements of the application. The invention herein is that the probe elements can be made as small as is needed and coupled with the use of appropriate signal differentiation/amplification/filtration, and in so doing one can obtain the desired signal quality and resolution which falls in the range of about 1 to 500 nA/sq. cm. or better. The purpose of the references electrodes is to effectively establish a reference field enveloping each sensing element which essentially isolates the element from unwanted stray potentials that can interfere with the measurement. The reference electrode can be configured into any suitable shape which may include a round, circular, square, or rectangular tube, pipe, or shell (which can be defined as a portion of the circumference of a pipe or tube). Alternately it can comprise one or more parallel running, regular-or irregular-shaped, conductive or partially conducting lines or rails. The reference electrodes also define the area in which the sensing element acquires its signal and effectively focuses the sensor on the precise "local" area. Typically the reference electrodes are connected to ground or alternately, depending upon the requirements, can be biased with a suitable dc, ac, or mixed ac-dc bias.

In one embodiment of the probe used in this invention two 10 micrometer sensing elements, created by the circular-shaped tips of two wire electrodes, are coupled at one end to larger 30 micrometer tungsten wires hook-up leads. These sensing elements are assembled in close planar alignment and held rigidly within a multilayer sandwich structure that comprises the high resolution probe. The outermost layers of the sandwich are made up of any suitable conductive plate material, in this embodiment thin aluminum sheets upon which a thin layer of a suitable dielectric film having a pressure sensitive adhesive (PSA) on one side, known as Kapton® adhesive tape, is layered. Kapton tape is a product of the DuPont Company, Circleville, Ohio, 43113. The sensing elements are then adhesively bound using the PSA layered film to each of the inside surfaces of the conductive plates where it thereby solidifies the multiple layers into a rigid unit probe. Additional manufacturing details will be discussed in reference to the drawings.

In measuring a small area electric field in one embodiment of this probe, a circular, miniature field probe of at about 5 microns in diameter is provided. The probe is electrically isolated from a surrounding metal, tubular-shaped reference electrode which is connected to a common ground and serves as a shield thereby effectively defining the local area that is sensed by the sensing element. It is used with a high precision electrometer capable of measuring currents in the nano- and pico-amp range that is connected between the isolated sensing electrode and ground. The probe is integrated into an x-y positional scanning mechanism to precisely move the electrode over a device under test (DUT) and thus measures the surface potential or charge density from a surface of interest contained upon the DUT. The probe of this invention comprises at least one and preferably two measurement electrodes (sensing elements) and a reference electrode for each sensing element. Depending upon the design and complexity of the desired sensor, the number of reference electrodes is at least one, but may be more. In general there must be sufficient reference electrodes to encircle or shield each measurement electrode. A single large reference electrode such as a conductive plate may be configured to accommodate several measurement electrodes. The reference electrode in one embodiment can be in the form of a pipe which completely surrounds the measurement electrode(s) or the reference electrode in another embodiment can be in the form of flat plates which are configured to substantially surround more than one measurement electrode. To minimize or eliminate cross talk between measurement electrodes, the distance between each sensing element or measurement electrode must be, in general, at least greater than the width dimension, or diameter if circular, of the individual measurement electrodes and preferably 2 to 10 times the width or diameter of the measurement electrode. In practice, the distance between any two sensing elements can be any suitable distance that assures that no significant cross interference or electrical shorting takes place between these sensing elements. This will be referred to in this disclosure and claims as "separation distance". Important to embodiments of this invention are: a. the size of and distance between the sensing elements b. that each sensing element or measuring electrode be at least substantially (80%) surrounded by a reference electrode (in the case of a tubular reference electrode 100% of the measuring electrode would be surrounded) and c. at least one sensing element is used and d. for every sensing element there is a sufficient reference electrode having a ground or suitable bias applied thereto.

Thus, there is always the same relationship of reference electrodes to measurement electrodes or, in other words, the area of the reference electrode(s) is sufficient to effectively encircle, shield, and isolate the individual sensor electrodes.

In an electrostatic marking system, streaks, spots, irregular lines, uneven development and other image flaws can be traced in many instances to uneven charging, contaminated components, faulty charging mechanisms, and/or to defects, imperfections, or other contamination to the electrostatic charge layers on the DUT. The field sensing probes used in the charger assembly of this invention can easily and effectively identify these flaws by the use of a suitable electrometer. The present controller either automatically corrects or alternatively indicates the specific corrective action needed to a user. The sensing elements or measurement electrodes in one embodiment of the probe can be made from small, viz 2-8 micron diameter, carbon fibers that have been nickel coated over the entire outer surface and can be electromechanically connected (or soldered) to a larger support wire, such as a 30 micron diameter tungsten wire which enable robust connection to a measurement circuit which can include an electrometer. The reference electrodes can be made from any conductive substances, including conductive metal plates, films, foils, tubes, or pipes.

The size and material of each component of this probe can vary depending on the requirements of the desired measurement and device DUT under test. The present invention can be used to ensure that a charge device (such as corotron) is providing acceptable charging uniformity before putting the device into the final xerographic assembly which may be a customer replaceable unit (CRU). This avoids the necessity of expensive print testing of the cartridge in a functioning printer before further investment is made in the CRU including shipping the CRU to a customer. Also, CRU remanufacturing companies may use this probe during development of replacement components for OEM charging cartridges to ensure equivalent performance to the OEM components or to an established standard. In addition, the compact size of the inventive self-monitoring and self-controlling charger allows for the installation within any particular xerographic engine. In this way, the probe can be used at various intervals during machine's life to assess the performance and reliability of the machine's functions, thereby using the output of these sensors or from the controller itself as a feedback signal for engine process control.

Given in one embodiment that two identical sensing elements are mounted in a co-planar arrangement on an integrated scanning probe having the aforementioned reference electrodes which are then scanned across a uniformly charged surface, two essentially identical output signals representative of the local area fields sensed by each sensing element can be extracted by the electronic circuit and meter. This unique arrangement of elements presents at least two opportunities for signal processing, display, assessment, or control. For example, should a malfunction occur in one of the signals for any reason, the experimental quality would not be compromised because at least one usable and valued signal would result. Further in this example, at least one valid signal would be available for not only monition of the charger but for control of its output as well. Alternatively, in the case where both signals are available and reliable, insights into the spatial or temporal difference between the signals can be extracted. The signal from one of the sensing elements upon acquiring its signal can be used as a fed to control a bias on the second sensor's measurement element or reference element. The second element in this case could precisely mirror the general level of the potential or charge on a subject surface and could thereby efficiently detect very small variations in the local area signal in contrast to the general area condition. In another embodiment, use of an extremely small, circular sensing element such as embodied by a single-walled, or multi-walled carbon, boron nitride, or other suitable conductive nanotube (CNT), nanorod or nanowire is envisioned. The CNT has a diameter in the range of about 2 to 100 nm and is enveloped by a suitable insulating layer, such as by a thin insulating polymer layer or ceramic layer of about 2 to 500 nm thick over which a suitable conductor is applied in a thin layer (typically about 2 to 500 nm thick) which can be electrically connected to ground. A suitable electric contact is made with the CNT sensing element that is amplified and filtered if required to produce an output signal representing an extremely small sample area, for example less than 1 square micron or even less than 0.10 sq microns. The multiple layers of this sensor can be affixed onto a suitable support to provide rigidity and/or mechanical strength to the assembly. The individual layers of the subject probe can be manufactured by a suitable gas or vapor phase deposition method generally known in the art, by metal electro-deposition either electroless or electrolytic, by combinations thereof or by any other suitable method or methods. Using the suggested manufacturing processes enable the aforedescribed small-size, multilayer devices to be mass produced and at low cost. Using this device and above-described described methodology, it is envisioned that extremely small charge levels and defect areas, for example less than 1 square micron in area and even less than 100 square nm at surface potentials below 1 millivolt per square micron which occur within a large charged surface, such as in an electrophotographic photoreceptor, can be detected and measured. The communication of the probe with the controller permits the controller to indicate to the user what corrective action is needed; i.e. clean the charger, replace the charger or corotron unit, replace a component of the charger, or properly install the charger. This can be operated as or by controllers used today in copy machines, automobiles and the like. For example, a flashing light such as "fix the corona", "clean the charger", "faulty corona installation" are a few problems that are flashed that can alert the user of the flaw to be corrected.

BRIEF DESCRIPTION OF THE DRAWINGS

FIG. 1 is an exploded view of an embodiment of this invention used with a typical wire corotron device.

FIG. 2 is an exploded view of an embodiment of this invention used with a typical pin corotron device.

DETAILED DESCRIPTION OF DRAWINGS AND PREFERRED EMBODIMENTS

Figure 1A:
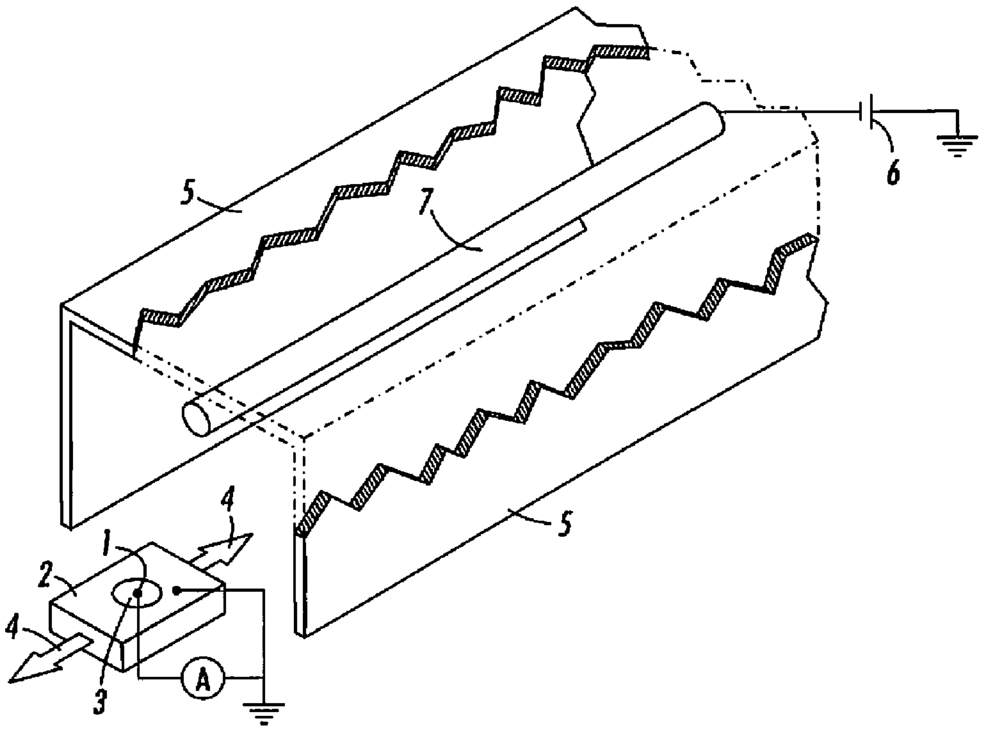
FIG. 1A is a side perspective view.
Figure 1B:
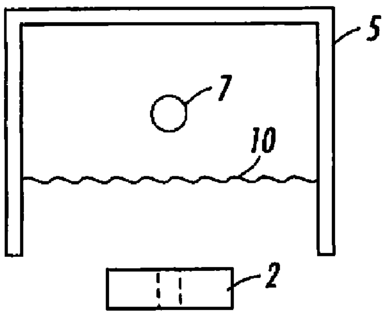
FIG. 1B is a front view of this wire corotron device.

FIG. 1 shows a typical wire corotron device, FIG. 1A shows a side view, and FIG. 1B shows a front view. The addition of a screen between the corotron wire 7 and the electroded probe 2 would make this a scorotron. In either arrangement, a high voltage DC bias 6 is applied to the tungsten wire 7. The surrounding shield 5 (shown cutaway in the Figure) may be attached to ground or a DC bias may be applied to it. An electric field is formed between the wire 7 and the shield 5 creating corona formation around the wire 7. This corona generates ions that are directed toward the item to be charged. The proposed sensor 2 is positioned directly under the wire coronode and can be moved in the direction of arrow 4. While the charge device is energized, the sensor 2 is traversed the entire length of the device and the ion density is simultaneously recorded in the form of current between the isolated electrode 1 and the grounded portion of the sensor 2 which are electrically insulated by insulating material 3. The peaks and valleys of this recorded data are used to determine if the charge device is providing sufficient charge density uniformity. If the magnitude of the difference between the maximum and minimum current in any given area of this recorded data is larger than a pre-determined amount (held in memory of the machine), the machine can take action to return the uniformity to a useable level. This action may be to alert the user to manually actuate a cleaning device that cleans any contamination from the wire and/or shield. Alternatively, a signal may be sent to process control of the machine to actuate an automatic cleaner that uses a motor and lead screw assembly to clean the device avoiding any customer intervention. Alternatively, the machine could put a message on the use interface to tell the customer to replace the charge device or xerographic module in order to return the image quality to acceptable levels.

Figure 2A:
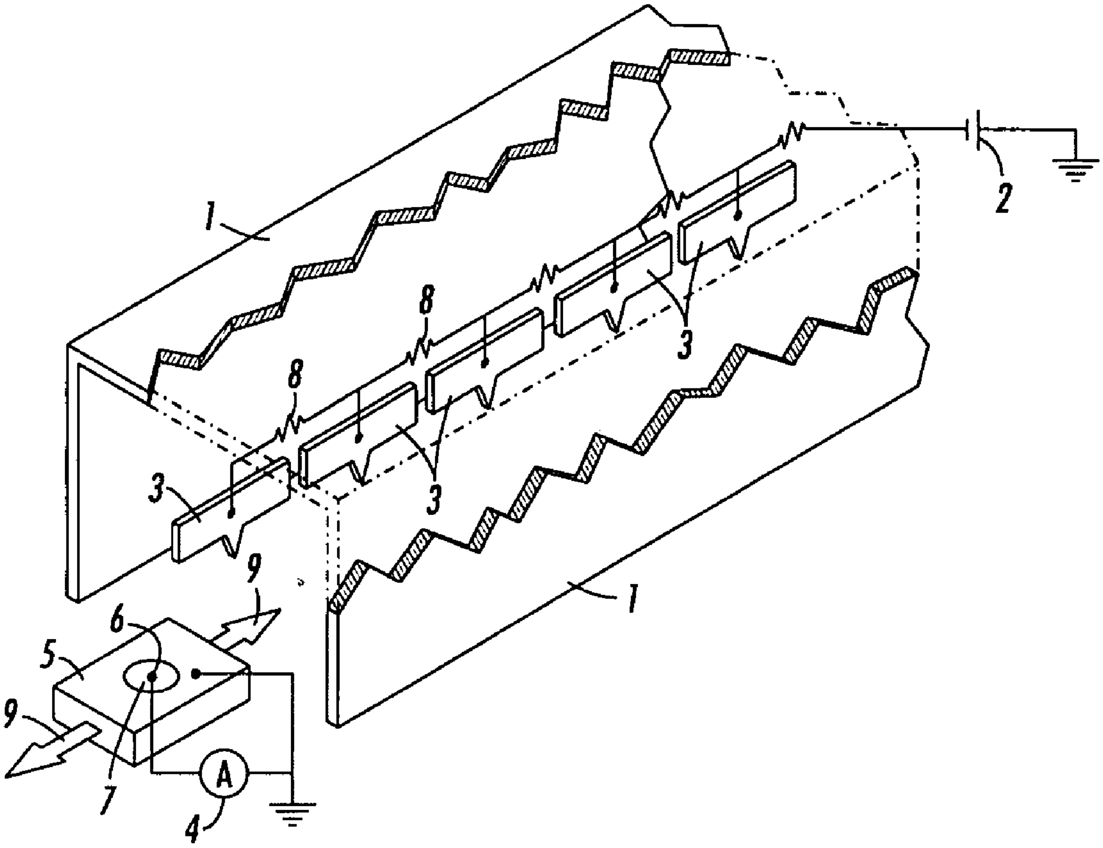
FIG. 2A is a side perspective view.
Figure 2B:
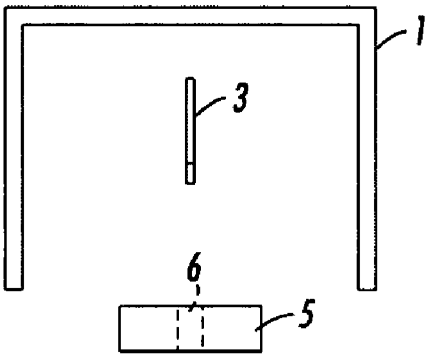
FIG. 2B is a front view of this pin corotron device.

FIG. 2 shows a pin corotron device, FIG. 2A shows a side view, and FIG. 2B shows a front view. The addition of a screen between the pins 3 and the electroded probe 5 would make this a scorotron. In addition, the individual pin coronodes 3 are electrically separated from each other and a voltage controlled resistance 8 is in series with each pin tip. This allows the DC voltage provided by the power supply 2 to be varied for each pin tip 3. Again, a high voltage DC bias is applied to pin tips 3. The surrounding shield 1 (shown cutaway in the Figure) may be grounded or have a DC bias applied to it. The electric field created causes corona generation at each pin tip which generated ions that are directed toward the surface to be charged. The proposed sensor 5 is positioned directly under the pin coronodes and can be moved in the direction of arrow 9. While the charge device is energized, the sensor 5 is traversed the entire length of the device and the ion density is simultaneously recorded in the form of current between the isolated electrode 6 and the grounded portion of the sensor 5 which are electrically insulated by insulating material 7. The peaks and valleys of this recorded data, along with the location along the device, are used to determine if the charge device is providing sufficient charge density uniformity. If the magnitude of the difference between the maximum and minimum current in any given area of this recorded data is larger than a pre-determined amount (held in memory of the machine), the machine can take action to return the uniformity to a useable level. If the charge density varies in a given location, the amount of voltage applied to the particular pin that corresponds to location of the non-uniformity in the measured data at that location can be adjusted accordingly to return the device to sufficient uniformity for printing. If the non-uniformity is larger than the average current, the voltage controlled resistor 8 can be increased to lower the output current of that particular pin thereby reducing the current in that location. Likewise, if the non-uniformity is lower than the average, the resistance 8 can be decreased to provide more current to that pin thereby increasing the current density under that pin.

Figure 3:
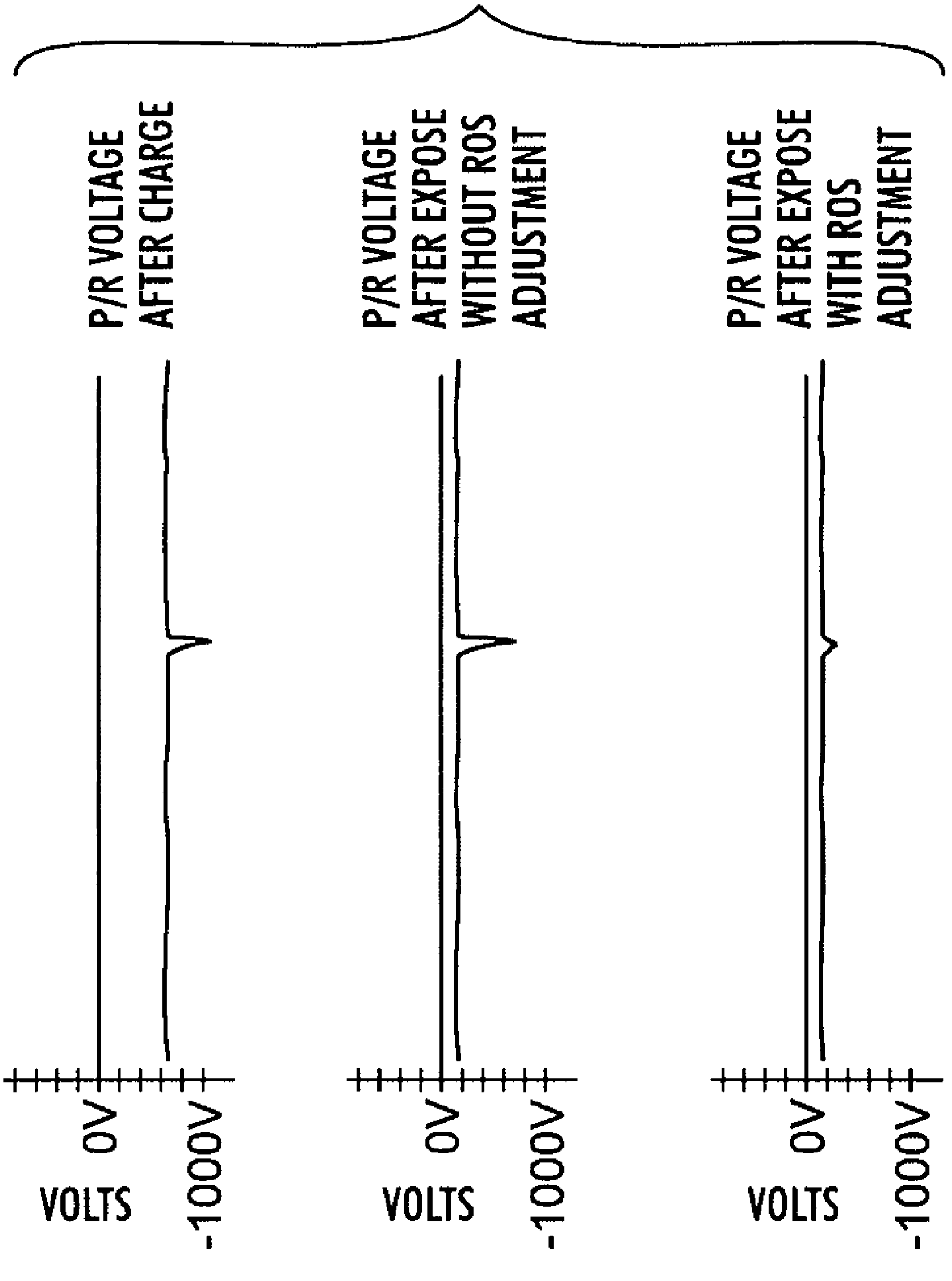
FIG. 3 is a graph showing a photoreceptor voltage or charge pattern that can be measured with an embodiment of the probe of this invention.

In FIG. 3, the top graph shows the photoreceptor voltage in the cross process direction. This charge pattern could be formed by any configuration of charge device, i.e. corotron, dicorotron, scorotron, etc. The dip in the voltage (negative peak) in the measured voltage could be due to localized contamination on the wire, wire defect and/or grid defect. This non-uniformity in the voltage remains after exposure by a laser ROS (raster optical scanner) or LED (light emitting diode) bar, as shown in the middle graph in FIG. 3. Because the non-uniformity remains, the user's output would show an objectionable white streak in the process direction. A scanning probe, as proposed in this invention, could be used to measure the current density being delivered by the charge device. Since current density is directly proportional to the final voltage on the drum, the recorded current scan would look identical to the top graph in FIG. 3. Once the non-uniformity is detected by the scanning probe, the machine's process controller can automatically adjust the exposure intensity in the localized region that contains the non-uniform charge area. The bottom graph shows the resulting exposed voltage on the photoreceptor after the exposure device is adjusted to account for the non-uniform charge that was measured by the proposed sensing device.

Figure 4:
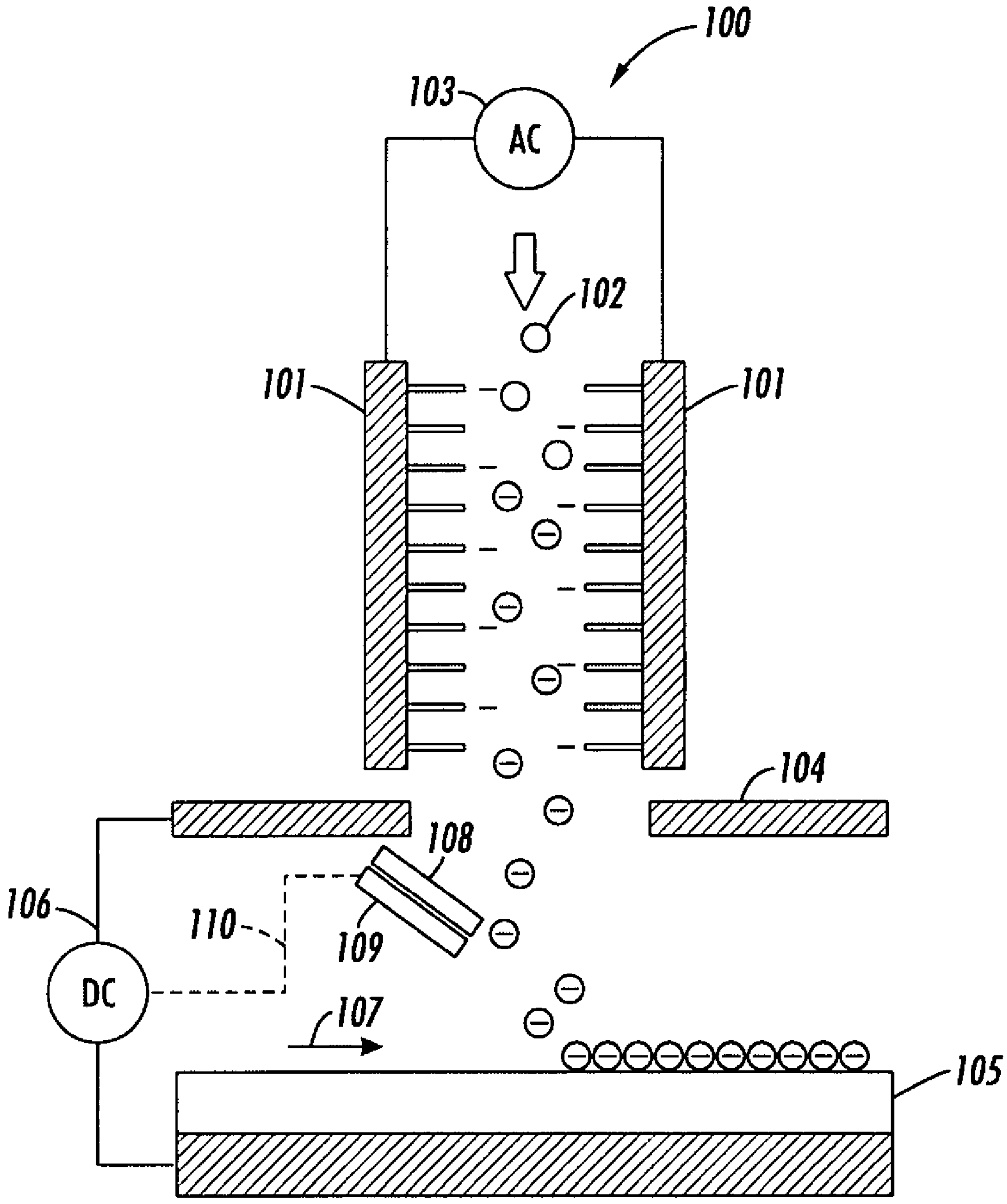
FIG. 4 illustrates the probe of this invention as used in an embodiment of a nanotube charging device.

FIG. 4 illustrates an embodiment of a cold charger device 100 comprising an opposing pair of conductive nanotube covered coronodes 101 configured to form a gap there between and defining a passageway for the movement of gas molecules 102 under pressure. The gas may be air. An AC field is created between the coronodes 101 by applying suitable AC potential 103 directly to the coronodes 101. Air molecules pass through the corona plasma (not shown) created by low field ionization at the tips of the nanotubes 101 and become ionized under the influence of this field created plasma. A split or porous grid 104 having open area sufficient to allow efficient passage of the ionized gas is positioned in the stream of ion molecules between the coronode pair and the surface to be charged 105 which can be a photoreceptor moving in the direction shown 107. A DC bias 106 can be imposed on the split grid 104 and used to direct and/or accelerate ions to the receptor 105 and to control the number of ions that reach the receptor. This action establishes the final charge on the receptor surface. At least one probe 108 with integrated controller 109 is positioned as shown in FIG. 4 to occupy a small area of the split grid opening and can serve to sample a portion of the ions moving in the stream as it passes from ion source 101 to receptor 105. The probe itself may be porous to allow passage of the gas through some or all of its structure. As the ions impact upon the surface of the probe, they create a change in its steady state condition which can be detected and subsequently output as a change in voltage or current depending upon the particular design of the subject device. A controller 109 receives the output from the probe 108 and sends a digital or analog signal 110 representing the magnitude of the change in state of the probe to the power supply controlling the bias on the split grid 104. Increases in positive voltage result in more ions passing through the grid and depositing on the receptor resulting in a higher charge on the receptor surface. Alternately, lower grid biases produce lower receptor surface charges.

Figure 5:
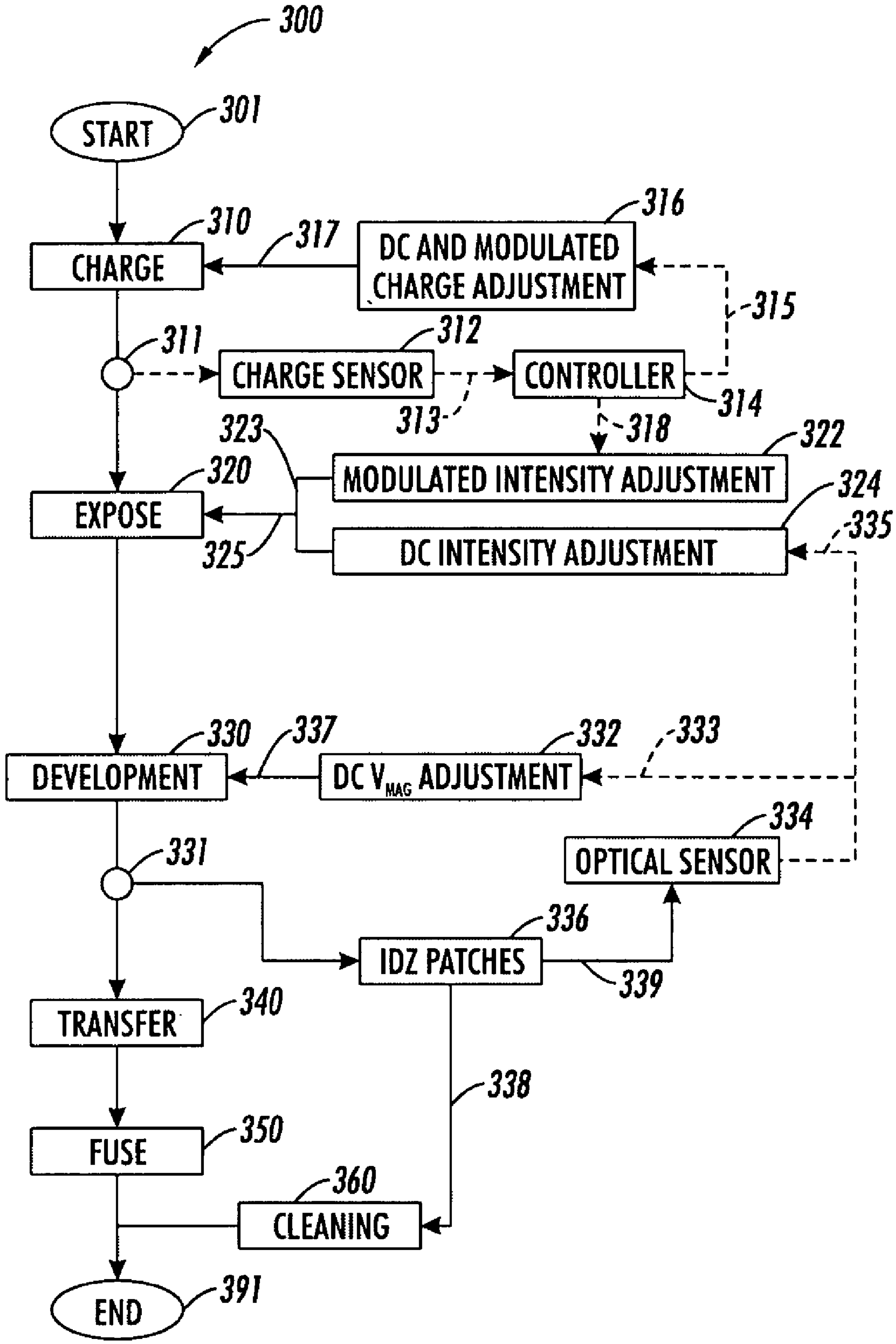
FIG. 5 illustrates the basic steps of the xerographic process in an embodiment of the sense-control-actuation scheme

FIG. 5 illustrates the basic steps of the xerographic process including one of the sense-control-actuation concepts described above. One illustrative embodiment of the sense-control-actuation protocol 300 as shown in FIG. 5 where is configured to interact with all of the sub-processes that comprise an electrographic printing process and related system. In a typical high speed Xerographic printing system, a series of sub-processes, such as charging 310, exposure 320, development 330, transfer 340, fusing 350, and cleaning 360 are performed in a continuous, interconnected sequence of operations, namely sub-processes, that is generally performed at least one time for each output print. Multiple prints are produced in an uninterrupted, continuous stream by reinitiating the start operation 301 for each desired print and proceeding through all of the sub-processes to reach the end point 391 where one print is the result. Typically, restarting the sequence is automated by an initial program requiring the user via, for example to interact with an appropriate user interface (not shown). Upon initiating 301 the print sequence, actuation of the charging device 310 occurs simultaneously with initiation of movement of the photoreceptor (not shown) resulting in application of a surface potential on the moving photoreceptor surface (not shown) whose magnitude and uniformity can be measured directly on that surface or by instantaneously sampling of the output of the charge device itself, or, both. The initial sensing position is indicated in FIG. 5 as point or region 311. A high resolution sensor probe 312 of the type described above is used to perform the sensing function. The output of sensor 312 is coupled by appropriate interface 313 to controller 314 which receives and monitors the output of the sensor 312 and provides at least one output which can be fed via appropriate interconnect 315 to charge controlling device 316, such as a power supply, which performs instantaneous and continuous adjustments to the voltage or current being supplied via interconnect 317 to the charging device 310. This sequence is referred to as a sense and feedback control loop. In addition, the output or an algorithm of the original output from the controller 314 can be simultaneously delivered by conduit 318, for example, to one or more other devices, such as the modulated intensity adjustment device 322, which interacts via interconnections 323 and 325 to modulate the intensity of the exposure device 320 in the exposure sub-process via real time adjustment of the dc intensity of the intensity adjustment device 324, which may be a power supply or other appropriate device. Additional inputs from other sensing and controlling devices as shown as inputs 335 and 333 can be used to further define the magnitude and frequency of adjustments that are made by the control to exposure device 320. Once charging and exposure occurs, a latent electrostatic image exists on the photoreceptor (p/r) that then undergoes development by a suitable development device 330 that delivers toner in an image-wise pattern to the p/r where the latent image becomes a visible image on the p/r surface. A voltage is applied by a power source and adjustment system 332 to the development device 330 which is typically a roller or series of rollers. Small area image patterns, or patches known as inter-document zone (IDZ) patches 336 can be viewed by a suitable optical sensor 334 through a suitable optical interconnect 339 resulting in sensing of image characteristics, including defects, at a point in thew process designated as 331 in FIG. 5. The toned image then undergoes transfer to media such as paper (not shown) via suitable transfer device 340 which may be a transfer roll, transfer belt, or corotrons device similar to those earlier described as charging devices. The toned media is transported to a suitable fusing station 350 where the image becomes permanent by application of heat and pressure. Any toner that remains on the p/r surface after transfer is typically removed by a cleaning operation 360 whose effectiveness may also be controlled by linkages to another optical sensor (not shown) and power source (not shown).

Clearly, the outputs from the charge 310 and expose 320 stations can be simultaneously controlled and jointly optimized by use of the charge sense-control-actuate scheme described. The use of software algorithms with embedded decision rules can interact with the charge sensor(s) output(s) along with print quality features as measured by the optical sensor(s) to determine and act upon which defects will require specific actuations of which devices. Given multiple options to correct any defect(s), a decision protocol within the software can be used to drive specific actuations of one or more devices to optimize the print quality of output prints from a high speed printer.

One or more probes may be chosen to monitor any desired area of the ion stream exiting the charging device. Arrays of the subject probe can be assembled and positioned to view as much or as little of the ion stream as desired. One or more sides of the grid may be monitored by the probe-controller devices. Obviously, in the case where many probe-controller outputs or a very large number of outputs are available to represent small area variability within a large ion stream, adjustment to the grid bias in a large number of very small sectors is needed in order to achieve control of any unacceptable local variation. For example, if uniformity across the entire ion stream at the millimeter level is the goal, or in other words where spatial variations greater than 1 mm×1 mm on the receptor are of concern, then probe measurement and control at distances across the length and width of the ion stream at slightly less than 1 mm are needed. This implies that the grid is configured into a large number of electrically isolated sectors and that the grid bias 106 can be segmented into a large number of individual biases and that each grid sector can be individually biased via control from its corresponding probe-controller.

Figure 6:
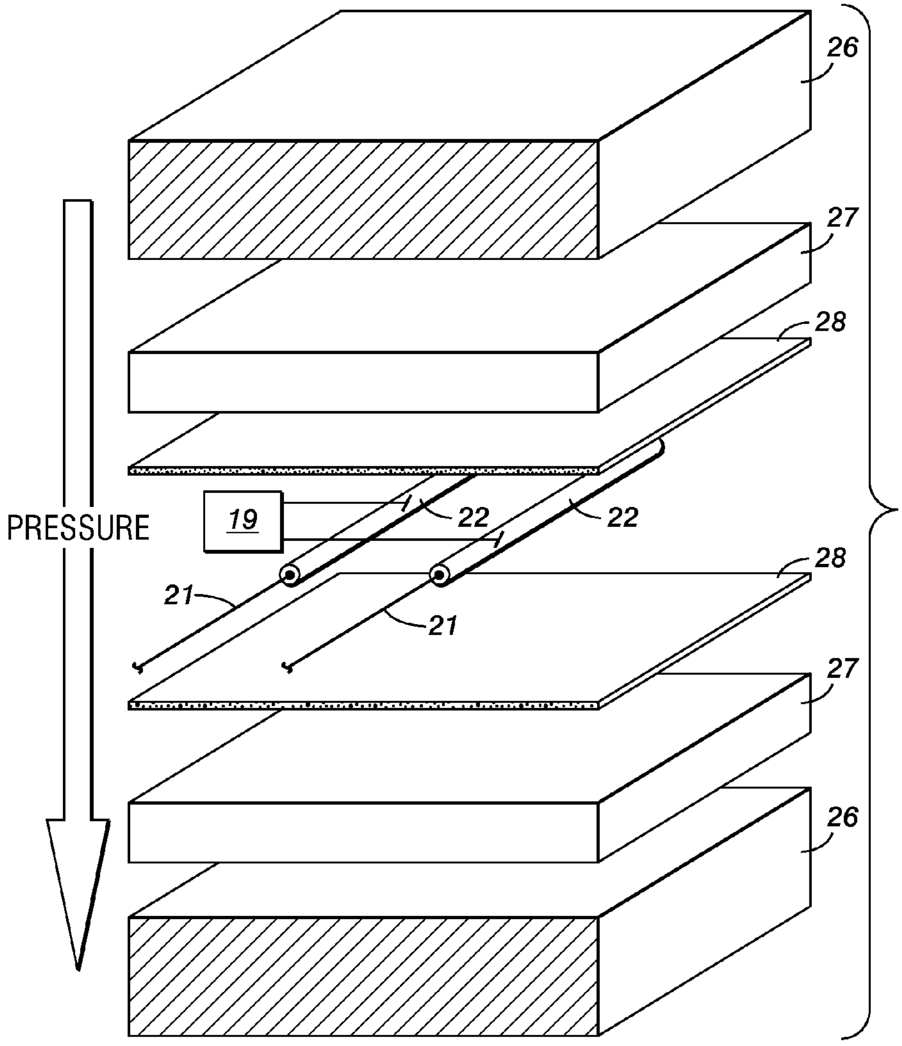
FIG. 6 is an exploded view of the components of an embodiment of the probe of this invention.
Figure 7:
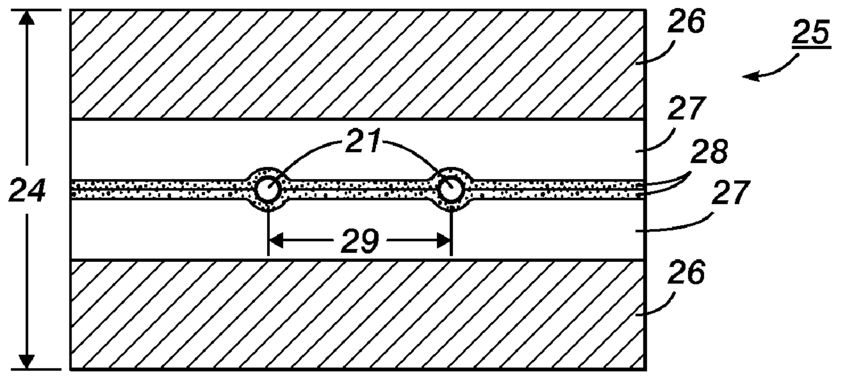
FIG. 7. is a front view of the assembled probe components shown in FIG 6.
Figure 8:
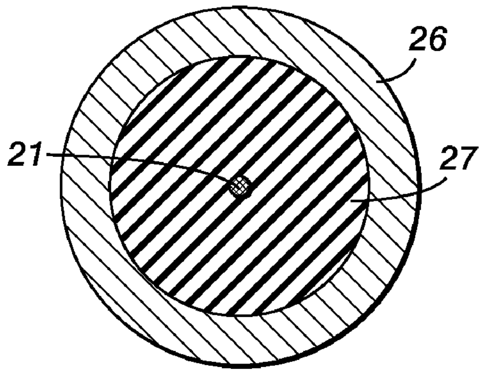
FIG. 8. shows an alternate co-axial, rod-in-tube configuration of an embodiment of the probe of this invention.

FIG. 6 illustrates an exploded view of the components of an embodiment of the present probe. Shown in FIGS. 6-8 are two ten micrometer sensing elements or measurement electrodes 21 coupled to larger diameter hook up leads 22 (30 micrometer diameter tungsten wire in this example). These leads 22 are electromechanically connected to the sensing elements 21 by solder 23 or any other suitable means. The leads 22 are attached by any suitable method to any suitable read out device, such as an electrometer 19. The probe has electronic detection resolution capabilities in the range of about 1 to 5 microns. The sensing elements 21 are assembled in close planar alignment and held rigidly within a multilayer sandwich configuration 24 (see FIG. 7) that comprises the high resolution probe 25. Pairings of the sensing elements 21 as shown in FIG. 7 may be aligned having a separation distance 29 that is equal or nearly equal along the entire span of their lengths. Likewise, the separation distance between connecting leads 22 as shown in FIG. 7 may be equal or nearly equal along their entire span. Alternatively, the sensing elements and connecting wires may be positioned to have a non-uniform or a variable separation distance (not shown) at one or more points along their lengths.

Referring to FIG. 7, the outermost layers of the sandwich 24 are made up of a suitable conductive plate material or reference electrode 26, for example, by thin aluminum sheets upon which a thin layer of a suitable dielectric film, foil or tape layer 27 is layered, such as polyvinylchloride, polyesters, Kapton®, or Teflon® that has, optionally, a pressure sensitive adhesive (PSA) 28 on one or both sides. Using the PSA 28, the sensing elements 21 are thereby adhesively bound to innermost sides of the insulating layers 27 or alternatively a thin layer of a suitable insulting adhesive (not shown) like fast curing epoxy maybe be used for this purpose. The outermost sides of the insulating layers 27 are secured onto the innermost sides of the conductive plates or reference electrodes 26 by a suitable insulating adhesive which may be a PSA 28 or by a suitable like fast curing epoxy adhesive, either of which is used to secure and solidify the multiple layers into a rigid sandwich unit 24 of FIG. 7. In addition, FIG. 7 shows the relative position and size of the sensing elements 21 within the multiple sandwich layers 24 of the probe 25. The distance 29 between the sensing elements 21 can be any suitable distance but in this embodiment and to enable easy manufacture, the distance is greater than about 2 to 10 times the diameter of either sensor 21, as well as greater than the diameter of the support wires 22. This distance 29 can assure that little or no cross-interference takes place between the sensing elements 21. The maximum distance 29 between the sensing elements 21 is governed by several factors which include such parameters as: the overall size of the device under test, the size of and distance between regions of interest on the target sample, the relative level of variation in the features of interest in the DUT, the size of the individual sensors 21, the size of the supporting interconnects 22, the presence of an insulating material such as an adhesive between the elements 21 and/or elements 22, the scan length capability of the probe 25, the rate of change of feature under examination in the subject area (for example, flickering), and/or the level of charge or surface potential being examined, etc. In practice, the distance between the sensors 21 will be selected to be close to the minimum, as above described, in order to achieve the greatest sensitivity. Furthermore, a suitable insulating media, such as an insulating adhesive, in general will be used along and between the sensing elements 21 and the supporting interconnects 22 to provide rigid support to the innermost layers of assembly 25 and to minimize mechanical vibration or cross talk and electric shorting between the elements.

In FIG. 8 an alternative pipe-like or co-axial configuration of the field probe is illustrated. The five to ten micron sensing element 21 (for example, made from a short length of a single carbon fiber that was extracted from a commercially available multifilament carbon fiber tow known as Hexcel AS 4 manufactured by the Hexcel Corp., Stamford, Conn. or equivalent) is used and is mounted in a central position within a conductive tube or reference electrode 26 having at least one conductive surface along its length. The thickness of the insulating material 27 used to electrically isolate the sensing element 21 from the surrounding metal 26 must be preferably between 2 to 10 times that of the diameter of the sensing element 21. This ensures that the non-tangent electric field lines from small local area potentials on the DUT going to the probe 25 are minimized, thereby enabling an accurate measurement of the charge of the surface or alternatively from the current being carried therebetween.

It will be appreciated that variations of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims.

What is claimed is:

1. A charging assembly for use with an electrostatically charged surface comprising in an operative arrangement:

a charging component or charger, an electric field probe and a controller, said controller in communication with said probe and configured to indicate corrective action required as a result of electronic flaws determined by said probe, said probe comprising a read-out device connected by circuitry thereto and configured to indicate results of said probe, said probe comprising in operative arrangement at least two sensing elements and at least two reference electrodes, said reference electrodes having a form selected from the group consisting of a conductive tube, pipe, or plate, each of said sensing elements substantially surrounded by at least two of said reference electrodes, said sensing elements configured to have a separation distance that causes little or no cross interference to take place between said sensing elements when positioned in concert with said surface, wherein said probe having electronic detection capabilities in the range of 1-500 microns and wherein said sensing elements are either uniformed or non-uniformed in width or diameter along the length of the element.

2. The assembly of claim 1 wherein said controller comprises logic and a control unit.

3. The assembly of claim 1 wherein said separation distance is at least about two (2) times a diameter or width of one of said sensing elements.

4. The assembly of claim 1 wherein said charger is a unit selected from the group consisting of electron-emitting pins, electron-emitting grids, single corona-charging structures, multiple corona-charging structures, dicorotron assemblies, and multiple dicorotron wire assemblies.

5. A charging assembly for use with an electrostatically charged surface comprising in an operative arrangement, a charging component or charger, an electric field probe and a controller, said controller in communication with said probe and configured to indicate corrective action required as a result of electronic flaws determined by said probe, said probe comprising a read-out device connected by circuitry thereto to indicate results of said probe, said probe comprising in operative arrangement at least two sensing elements and at least two reference electrodes, each of said sensing elements at least substantially surrounded by at least one of said reference electrodes, said sensing elements having a separation distance that causes little or no cross interference to take place between said sensing elements when positioned in concert with the surface of interest and wherein said sensing elements are micron or sub-micron sized.

6. The assembly of claim 5 wherein said charger is a unit selected from the group consisting of electron-emitting pins, electron-emitting grids, single corona-charging structures, multiple corona-charging structures, dicorotrons assemblies and multiple dicorotron wire assemblies.

* * * * *